(12) United States Patent
Chiu

(10) Patent No.: US 6,758,940 B2
(45) Date of Patent: Jul. 6, 2004

(54) APPARATUS AND METHOD FOR CONTROLLING BOILING CONDITIONS OF HOT PHOSPHORIC ACID SOLUTION WITH PRESSURE ADJUSTMENT

(75) Inventor: John Chiu, Hsinchu (TW)

(73) Assignee: Mosel Vitelic Inc., Hsin-chu (TW)

( * ) Notice: Subject to any disclaimer, the term of this patent is extended or adjusted under 35 U.S.C. 154(b) by 235 days.

(21) Appl. No.: 09/796,166

(22) Filed: Feb. 28, 2001

(65) Prior Publication Data

US 2002/0007803 A1 Jan. 24, 2002

(30) Foreign Application Priority Data

Jun. 8, 2000 (TW) .......................................... 89111219 A

(51) Int. Cl.[7] .............................................. C23F 1/02
(52) U.S. Cl. ............................ 156/345.15; 156/345.11
(58) Field of Search ........................ 156/345.15, 345.11

(56) References Cited

U.S. PATENT DOCUMENTS 4,759,817 A * 7/1988 Aigo ..................... 156/345.15
6,129,335 A * 10/2000 Yokogi ..................... 251/212
6,203,659 B1 * 3/2001 Shen et al. ............. 156/345.15
6,398,904 B1 * 6/2002 Heo et al. ................. 118/726

* cited by examiner

Primary Examiner—Luz Alejandro-Mulero
Assistant Examiner—Sylvia R. MacArthur
(74) Attorney, Agent, or Firm—Thomas, Kayden, Horstemeyer & Risley

(57) ABSTRACT

Disclosed is an apparatus and method for controlling boiling condition of hot $H_3PO_4$ solution by adjusting the vapor extracting rate thereof, wherein an acid tank filled with hot $H_3PO_4$ solution to a level surface is located in a treatment room and a temperature thermocouple is arranged above the level surface of the hot $H_3PO_4$ solution to monitor the vapor temperature near the level surface of the $H_3PO_4$ solution. The vapor temperature is used to adjust the extracting rate of the treatment room by control of a damper connected to an outlet of the treatment room. According to the present invention, the treatment apparatus and method can control the boiling condition of the hot $H_3PO_4$ solution thereof by properly adjusting the extracting rate, and therefore avoid defects and loss of control in manufacturing processes.

9 Claims, 3 Drawing Sheets

APPARATUS AND METHOD FOR CONTROLLING BOILING CONDITIONS OF HOT PHOSPHORIC ACID SOLUTION WITH PRESSURE ADJUSTMENT

FIELD OF THE INVENTION

The present invention relates generally to a treatment apparatus and method for hot phosphoric acid ($H_3PO_4$) solution, and more particularly, to an apparatus and method for controlling boiling conditions of hot $H_3PO_4$ solution by adjusting extracting rate thereof.

BACKGROUND OF THE INVENTION $H_3PO_4$ has a lot of applications in industries, for example, in manufacturing processes of integrated circuits formed within semiconductor substrates. It is always the case to make micro patterns on wafers in the manufacture of the integrated circuits, in which etching technique is the primary method for forming these patterns. The etching process transfers the micro pattern of a photo resist precisely rendered with lithography technique, in the form of lines, surfaces, or holes, to the material under the photo resist in order to form a complex structure required by the integrated circuit. The pattern transfer combining the etching process and lithography technique therefore plays a vital role in the semiconductor manufacturing processes.

Silicon nitride ($Si_3N_4$) is often used as a mask for forming field oxide (FOX) during oxidation processes and passivation layer over a semiconductor device. Traditionally, $Si_3N_4$ is etched by use of a spiking hot $H_3PO_4$ solution. To maximize the etching rate, deionized (DI) water spiking for the hot $H_3PO_4$ solution should be controlled and heat is provided by a heater so as to keep the $H_3PO_4$ solution in a specific boiling condition. The boiling condition of the hot $H_3PO_4$ solution can be fine-tuned, which is done by checking whether or not the temperature of the hot $H_3PO_4$ solution reaches the setting value and also by checking the boiling condition with visual inspection. In the etching process with the hot $H_3PO_4$ solution, if the boiling condition is too violent, the wafer under etched will have undesired displacement; while if the boiling condition is insufficient, an ideal etching rate will not be obtained.

However, in the practical etching processes, even though the $H_3PO_4$ solution temperature is kept constant, the DI water spiking is kept constant, and the output of the heater is also kept constant, the boiling condition of the $H_3PO_4$ solution differs. That is, the $H_3PO_4$ treatment cannot get the desired control, thus resulting in defects and loss of control in the manufacturing process. Therefore, it is desired an improved apparatus and method for a better control of boiling conditions of the $H_3PO_4$ solution.

SUMMARY OF THE INVENTION

An object of the present invention is to provide an apparatus and method for controlling boiling conditions of hot $H_3PO_4$ solution to solve the problem mentioned above.

According to the present invention, an apparatus for controlling boiling conditions of hot $H_3PO_4$ solution comprise an acid tank filled with hot $H_3PO_4$ solution thereof and located in a treatment room. A temperature thermocouple is arranged above the level surface of the hot $H_3PO_4$ solution to monitor the vapor temperature of the hot $H_3PO_4$ solution, and a damper under control is connected to the outlet of the treatment room so as to control the extracting rate of vapor from the treatment room.

According to the method of the present invention, the vapor temperature measured by the temperature thermocouple above the level surface of the hot $H_3PO_4$ solution is used to determine the boiling condition of the hot $H_3PO_4$ solution, which is in turn used to adjust the extracting rate of vapor from the treatment room in order to maintain the desired boiling condition. Given the same heating condition and the temperature of the hot $H_3PO_4$ solution being maintained constant, when the extracting rate is low, less heat is lost and the rate of heat diffusion is low, so that the hot $H_3PO_4$ solution is in a violent boiling condition. On the contrary, when the extracting rate is higher, more heat is lost and the rate of heat diffusion is high, so that the $H_3PO_4$ solution is in a gentle boiling condition.

BRIEF DESCRIPTION OF THE DRAWINGS

These and other objects, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

Figure 1:
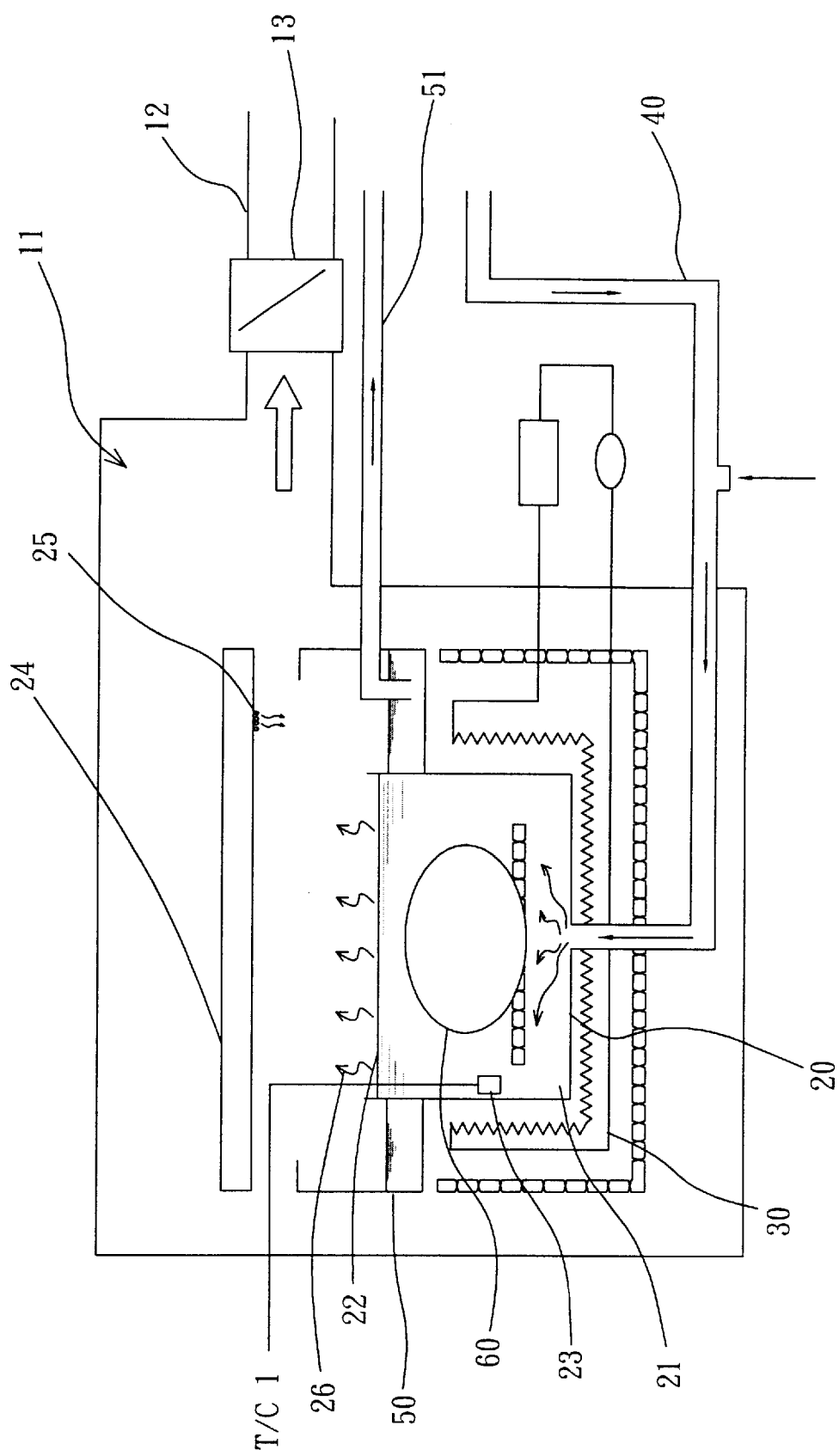
FIG. 1 shows an illustrative diagram of a conventional apparatus for an $H_3PO_4$ solution treatment in semiconductor manufacturing processes.

The mechanism and principle of the hot $H_3PO_4$ treatment apparatus is first explained. A traditional $H_3PO_4$ treatment apparatus, as shown in FIG. 1, employs a closed or almost closed treatment room 11 with an outlet 12 connected to a damper 13, from where the vapor of the treatment room 11 is extracted out. An acid tank 20 filled with hot $H_3PO_4$ solution 21 to a level surface 22 is placed in the treatment room 11. A heater 30 for providing heat to boil the $H_3PO_4$ solution 21 is arranged outside and close to the acid tank 20 and another heater (in-line heater, not shown in the figure) is positioned outside the treatment room 11. To monitor the temperature of the hot $H_3PO_4$ solution 21, a thermocouple 23 is dipped in the hot $H_3PO_4$ solution 21. A top cover 24 is placed above the level surface 22 of the hot $H_3PO_4$ solution 21, and DI water is guided into the acid tank 20 by a pipeline 40 connected to the acid tank 20. An outer tank 50, which provides a cyclic heating route for the mixed solution 21 within the acid tank 20, is positioned outside the acid tank 20. In addition, the mixed solution 21 in the acid tank 20 is transferred by a pipeline 51 and extracted by a pump, is filtered by a filter and heated by an in-line heater, and then enters the cyclic path through the pipeline 40 at the bottom of the acid tank 20 to recycle.

In the practical manufacturing processes, the heater 30 provides the heat to let the hot $H_3PO_4$ solution 21 be boiled and the boiling temperature of the hot $H_3PO_4$ solution 21 is monitored by the temperature thermocouple 23. Visual inspection also helps if the boiling condition is to be checked. A wafer 60 is placed into the acid tank 20 and is covered with the hot $H_3PO_4$ solution 21. The heater 30 heats the acid tank 21 and the input of the DI water into the acid tank 20 is controlled so that the hot $H_3PO_4$ solution 21 is kept in a specific and stable boiling condition. If the hot H$_3$PO$_4$ solution 21 boils violently, then the wafer 60 being etched will be moved; on the contrary, if the hot H$_3$PO$_4$ solution 21 boils insufficiently, then the ideal etching rate cannot be reached.

However, during the practical etching processes, even the output of the heater 30 is kept constant, the temperature of the hot H$_3$PO$_4$ solution 21 is kept constant, and the input of the DI water is also kept constant, the hot H$_3$PO$_4$ solution 21 still shows different boiling conditions. That is, the hot H$_3$PO$_4$ solution 21 is either in violent or under boiling condition, so that the wafer 60 being etched will be undesirably moved or the ideal etching rate cannot be reached. By practical experiments, it is found that the vapor-extracting rate at the outlet 12 of the treatment room 11 has great impact on the boiling conditions of the hot H$_3$PO$_4$ 21 and must be well controlled.

Figure 2A:
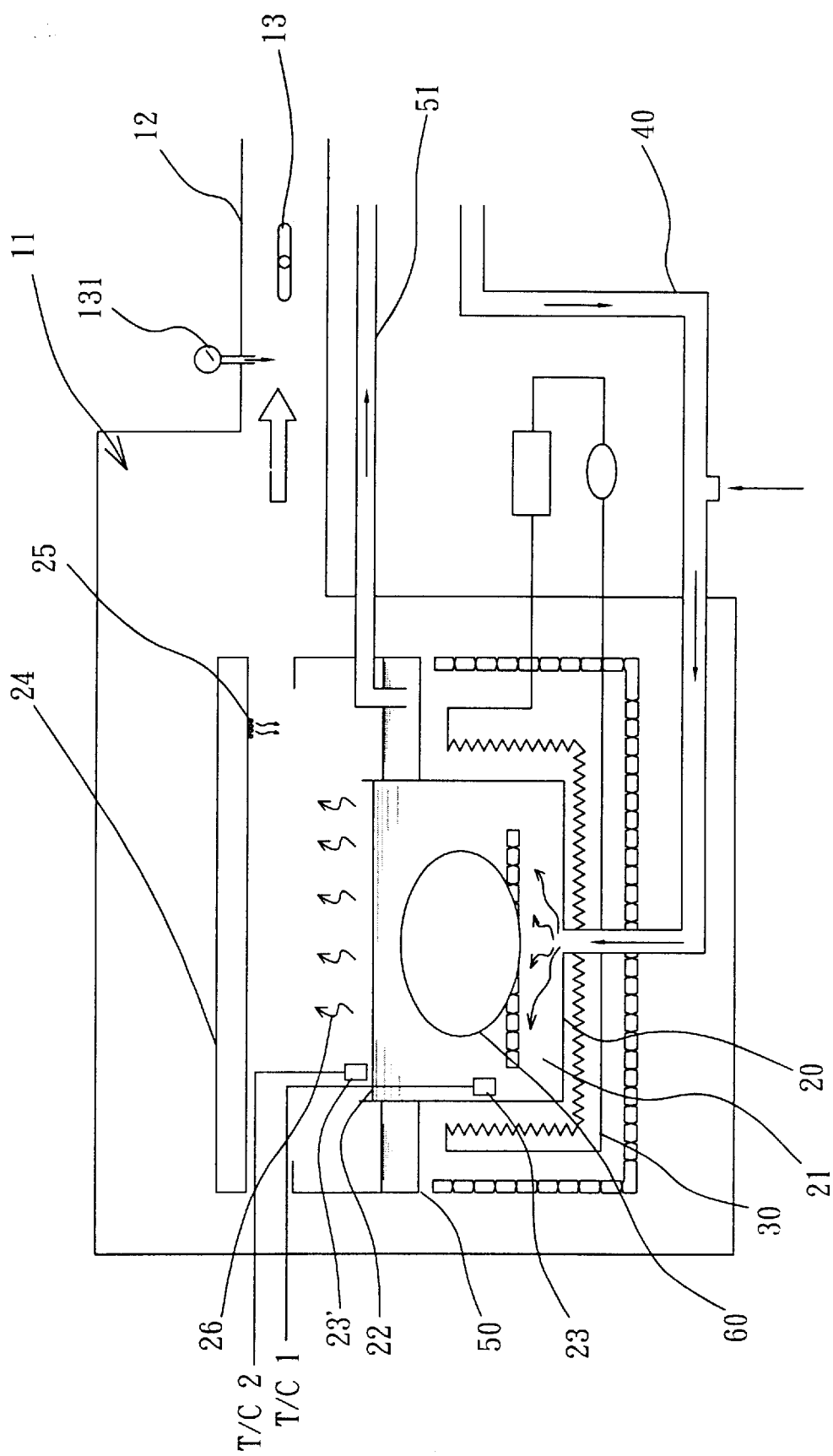
FIG. 2a shows an illustrative diagram of one apparatus embodiment according to the present invention with a treatment room connected to a damper set in full-open state.

The hot H$_3$PO$_4$ treatment apparatus according to the present invention is shown in FIG. 2a. In the treatment room 11, the DI water is infused with steady input volume into the acid tank 20 via the pipeline 40, and the heater 30 also has a steady output. The temperature of the hot H$_3$PO$_4$ solution 21 contained in the acid tank 20 is monitored by the temperature thermocouple 23, as in the prior art; however, another temperature thermocouple 23' is additionally arranged above the level surface 22 of the hot H$_3$PO$_4$ solution 21 to monitor the temperature of vapor 26 evaporated from the hot H$_3$PO$_4$ solution 21. The temperature monitored by the thermocouple 23' is used to adjust the heat diffusion from the outlet 12 by the control of the damper 13, typically a butterfly damper. For a better control, a pressure gauge 131 is further installed in front of the damper 13 so as to monitor the pressure at the outlet 12. It is noted that a pressure gauge measures a pressure variation from a reference pressure, so does the pressure gauge 131. Fine-tuning the damper 13 and thus controlling the extracting rate of vapor from the treatment room 11 so that the hot H$_3$PO$_4$ solution 21 can be maintained at desired boiling conditions.

The present invention employs the data gathered by the temperature thermocouple 23' to determine and control the boiling condition of the hot H$_3$PO$_4$ solution 21 by opening the damper 13 wider or narrower. For such circumstances, when vapor is extracted from the treatment room 11, a negative pressure is read on the pressure gauge 131. As shown in FIG. 2a, the damper 13 is in full-opened condition, so that the extracting rate is maximized and the absolute value of the pressure measured by the pressure gauge 131 is also maximized (based on Bernoulli law). At this time, the heat diffusion rate of the acid tank 20 is maximal, so the hot H$_3$PO$_4$ solution 21 cannot get enough heat and consequently it will not be sufficiently boiling.

Figure 2B:
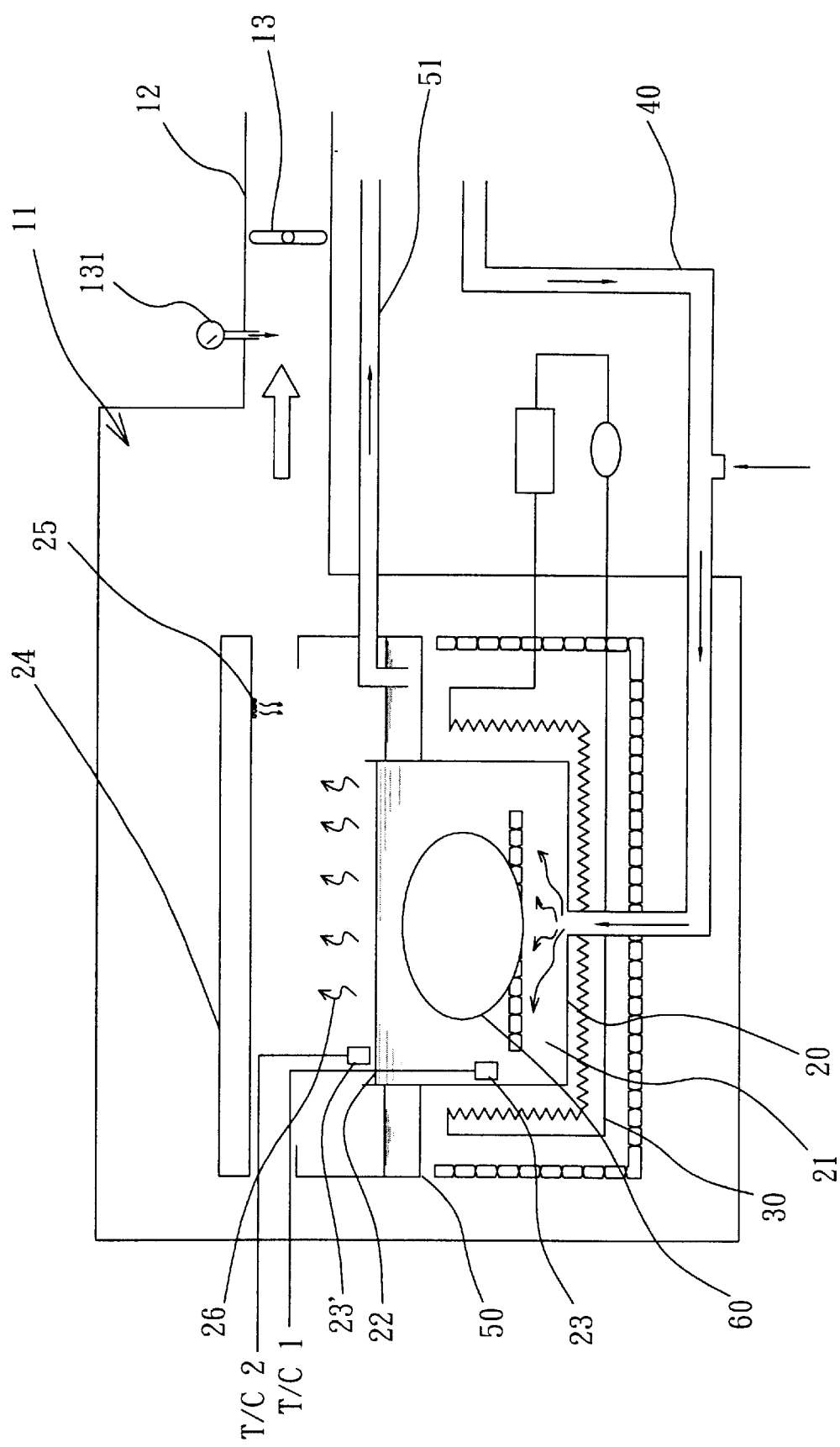
FIG. 2b shows an illustrative diagram of the apparatus shown in FIG. 2a with the damper closed.

FIG. 2b shows an illustration of the apparatus of FIG. 2a with the damper 13 is in full closed condition. When the damper 13 is in the closed condition or is in a slightly opened condition, the pressure value measured by the pressure gauge 131 is very low, which means that its extracting rate is also very low. At this time, the heat diffusion rate of the acid tank 13 is small, so the H$_3$PO$_4$ solution 21 has enough heat to be maintained in a sufficient boiling condition.

The data acquired from experiments, which is done according to the apparatus of FIGS. 2a/2b, is shown as following table:

TABLE 1

| Bath heater (30) O/P | 95% | 95% | 95% |
|---|---|---|---|
| In-line heater O/P | 100% | 100% | 100% |
| Outlet pressure (131) Ex-acid pressure (mm-H$_2$O) | −20 | −10 | −5 |
| Solution temperature thermocouple (23) T/C 1 (° C.) | 160 | 160 | 160 |
| Vapor temperature thermocouple (23') T/C 2 (° C.) | 55~67 | 77~82 | 88~93 |
| Etching rate to Si$_3$N$_4$ (A/min) | 43 | 50 | NA |
| Visual boiling condition | No boiling | Gentle | Violent |

During the experimental etching processes, the output of the heater 30 is kept constant (95%) and the output temperature of the in-line heater is also kept constant (100%). Given the measure of the temperature thermocouple 23 and the condition in which the temperature of the hot H$_3$PO$_4$ solution 21 is kept constant (160° C.) and the input of the DI water (not shown in the table) is also kept constant, the temperature measured by the thermocouple 23' and the (negative) pressure measured by the pressure gauge 131 at the outlet 12 can be used to adjust the pressure-extracting rate of the damper 13. As shown in Table 1, when the vapor temperature measured by the thermocouple 23' is in the range of about 55–67° C., the measured pressure of the pressure gauge 131 at the outlet 12 is −20 mm-H$_2$O. At this time, the hot H$_3$PO$_4$ solution 21 in the acid tank 20 is not in a boiling condition. However, when the vapor temperature measured by the thermocouple 23' is in the range of about 77–82° C., the pressure of the outlet 12 is −10 mm-H$_2$O. At this time, the hot H$_3$PO$_4$ solution 21 is in a gentle boiling condition. While the vapor temperature measured by the thermocouple 23' is in the range of about 88–93° C., the pressure of the outlet 12 is −5 mm-H$_2$O. At this time, the hot H$_3$PO$_4$ solution 21 is in a violent boiling condition. That is, given the same heating condition and the temperature of the hot H$_3$PO$_4$ solution 21 being kept constant, the more the negative pressure 131 measured at the outlet 12 is, the lower the vapor temperature measured is. On the contrary, the less the negative pressure 131 measured at the outlet 12 is, the higher the vapor temperature measured is. It can be concluded that by adjusting the damper 13 to control the vapor extracting rate of the treatment room 11, the hot H$_3$PO$_4$ solution 21 can be precisely controlled and maintained in expected boiling conditions so as to reach the best etching rate for the wafer 60 and avoid defects and loss of control during the manufacturing processes.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. An apparatus for controlling boiling condition of hot H$_3$PO$_4$ solution with pressure adjustment, comprising:

a treatment room with an a outlet;

an acid tank located in said treatment room filled with hot H$_3$PO$_4$ solution to a level surface;

a heater for providing heat to said hot H$_3$PO$_4$ solution;

a pipeline connected to said acid tank for guiding DI water into said acid tank;

a temperature thermocouple arranged above said level surface for monitoring temperature near said level surface, which said temperature is used for adjusting vapor-extracting rate of said treatment room; and a damper connected to said outlet for controlling the vapor-extracting rate of said treatment room.

2. An apparatus according to claim 1, further comprising a second temperature thermocouple dipped in said hot $H_3PO_4$ solution for monitoring temperature of said hot $H_3PO_4$ solution.

3. An apparatus according to claim 1, further comprising a top cover placed above said level surface of said hot $H_3PO_4$ solution.

4. An apparatus according to claim 1, further comprising an external tank outside said acid tank for providing a cyclic heating path for said hot $H_3PO_4$ solution in said acid tank.

5. An apparatus according to claim 1, further comprising a pressure gauge arranged near said damper.

6. An apparatus for controlling boiling condition of hot $H_3PO_4$ solution with pressure adjustment, comprising:

a treatment room with an a outlet;

an acid tank located in said treatment room filled with hot $H_3PO_4$ solution to a level surface;

a heater for providing heat to said hot $H_3PO_4$ solution;

a pipeline connected to said acid tank for guiding DI water into said acid tank;

a first temperature thermocouple arranged above said level surface for monitoring temperature near said level surface, which said temperature is used for adjusting vapor-extracting rate of said treatment room;

a second temperature thermocouple dipped in said hot $H_3PO_4$ solution for monitoring temperature of said hot $H_3PO_4$ solution;

a top cover placed above said level surface of said hot $H_3PO_4$ solution;

an external tank outside said acid tank for providing a cyclic heating path for said hot $H_3PO_4$ solution in said acid tank;

a damper connected to said outlet for controlling the vapor-extracting rate of said treatment room;

a pressure gauge arranged near said damper.

7. An apparatus according to claim 6, wherein the temperature measured by the first temperature thermocouple is used for adjusting the damper.

8. An apparatus according to claim 6, wherein the pressure measured by the pressure gauge is used for adjusting the damper.

9. An apparatus according to claim 6, wherein the temperature measured by the first temperature thermocouple is used for determining the boiling condition of said hot $H_3PO_4$ solution.

* * * * *